United States Patent
Wagner et al.

(10) Patent No.: US 7,235,347 B2
(45) Date of Patent: *Jun. 26, 2007

(54) LOW PH DEVELOPMENT SOLUTIONS FOR CHEMICALLY AMPLIFIED PHOTORESISTS

(75) Inventors: Mark Wagner, Raleigh, NC (US); Merrick Miles, Raleigh, NC (US); Chris Harbinson, Raleigh, NC (US)

(73) Assignee: Micell Technologies, Inc., Raleigh, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/133,077

(22) Filed: May 19, 2005

(65) Prior Publication Data

US 2005/0208429 A1    Sep. 22, 2005

Related U.S. Application Data

(63) Continuation-in-part of application No. 10/294,222, filed on Nov. 14, 2002, now Pat. No. 6,919,167.

(51) Int. Cl.
*G03F 7/30*    (2006.01)

(52) U.S. Cl. .......................... 430/311; 430/325

(58) Field of Classification Search ................ 430/311, 430/325
See application file for complete search history.

(56) References Cited

U.S. PATENT DOCUMENTS

| | | | |
|---|---|---|---|
| 5,532,106 | A | 7/1996 | Fréchet et al. |
| 5,532,113 | A | 7/1996 | Fréchet et al. |
| 5,536,616 | A | 7/1996 | Fréchet et al. |
| 5,545,509 | A | 8/1996 | Cameron et al. |
| 5,648,196 | A | 7/1997 | Fréchet et al. |
| 5,665,527 | A | 9/1997 | Allen et al. |
| 6,001,418 | A | 12/1999 | DeSimone et al. |
| 6,083,565 | A | 7/2000 | Carbonell et al. |
| 6,379,874 | B1 | 4/2002 | Ober et al. |
| 6,737,215 | B2 | 5/2004 | Dammel et al. |
| 7,044,143 | B2 * | 5/2006 | DeYoung et al. .......... 134/105 |
| 2002/0119398 | A1 * | 8/2002 | DeSimone et al. ......... 430/315 |
| 2003/0047533 | A1 | 3/2003 | Reid et al. |
| 2004/0096779 | A1 | 5/2004 | DeSimone |

OTHER PUBLICATIONS

Cameron, James F., et al., Photogeneration of amines from α-keto carbamates: design and preparation of photoactive compounds, *J. Chem. Soc.*, 1:2429-2442 (1997).
Fréchet, Jean M.J.,et al., Photogenerated Base in Resist and Imaging Materials: Design of Functional Polymers Susceptible to Base Catalyzed Decarboxylation, *Chem. Mater.*, 9: 2887-2893 (1997).
Harvard, Jennifer M., et al., Functional Design of Environmentally enhanced Water-Soluble Positive-Tone Photoresists, *Polym. Mat. Sci. Eng.*, 77:424-5 (1997).
International Search Report for PCT/US03/36670; Date of Mailing Jan. 10, 2005.
Jackson et al.; "Surfactants and Microemulsions in Supercritical Fluids" 87-120 (1998).
Pham, Victor Q., et al., Positive-Tone Resists for Supercritical $CO_2$ Processing, *Polymer Preprints*, 43(2): 885-6 (2002).
Sundararajan et al.; "Supercritical CO2 Processing for Submicron Imaging of Fluoropolymers"41-48 (2000).
Urankar, Edward J., et al., Base-Sensitive Polymers as Imaging Materials: Radiation-Induced β-Elimination To Yield Poly (4-hydroxystyrene), *Macromolecules*, 30: 1304-1310 (1997).
Urankar, Edward J., et al., Photogenerated Base in Polymer Curing and Imaging: Design of Reactive Styrenic Copolymers Susceptible to a Base-Catalyzed β-Elimination, *Journal of Polymer Science:Journal of Polymer Science: Part A: Polymer Chemistry*, 35:3543-3552 (1997).
Urankar, Edward J., et al., Photogenerated Base in Polymer Curing and Imaging: Cross-Linking of Base-Sensitive Polymers Containing Enolizable Pendant Groups, *Chem. Mater.*, 9: 2861-2868 (1997).

\* cited by examiner

*Primary Examiner*—Hoa Van Le
(74) *Attorney, Agent, or Firm*—Myers Bigel Sibley & Sajovec, P.A.

(57) ABSTRACT

A method for carrying out positive tone lithography with a carbon dioxide development system is carried out by: (a) providing a substrate, the substrate having a polymer resist layer formed thereon, (b) exposing at least one portion of the polymer resist layer to radiant energy causing a chemical shift to take place in the exposed portion and thereby form at least one light field region in the polymer resist layer while concurrently maintaining at least one portion of the polymer layer unexposed to the radiant energy to thereby form at least one dark field region in the polymer resist layer; (c) optionally baking the polymer resist layer; (d) contacting the polymer resist layer to a carbon dioxide solvent system, the solvent system comprising a polar group, under conditions in which the at least one light field region is preferentially removed from the substrate by the carbon dioxide solvent system as compared to the at least one dark field region; wherein the carbon dioxide solvent system comprises a first phase and a second phase, the first phase comprising carbon dioxide and the second phase comprising a polar fluid, with the at least one light field region being preferentially soluble in the polar fluid as compared to the at least one dark field region.

20 Claims, No Drawings

LOW PH DEVELOPMENT SOLUTIONS FOR CHEMICALLY AMPLIFIED PHOTORESISTS

RELATED APPLICATIONS

This application is a continuation-in-part of U.S. patent application Ser. No. 10/294,222, filed Nov. 14, 2002, now U.S. Pat. No. 6,919,167 the disclosure of which is incorporated by reference herein in its entirety.

FIELD OF THE INVENTION

The present invention concerns lithographic methods, particularly methods for the preferential removal of light-field regions which may be used to form patterned regions on substrates such as microelectronic substrates.

BACKGROUND OF THE INVENTION

In photolithography using chemically amplified resists, the area of photoresist film exposed to incident radiation undergoes a chemical transformation. For most resists systems designed for traditional aqueous base development, this transformation results in a significant increase in polarity. For these systems, traditionally termed positive tone resist systems, the exposed region is removed during development with an aqueous base. Aqueous solutions of tetramethyl ammonium hydroxide (TMAH) are most commonly used as the photoresist developer. In order for development in aqueous base to be effective, the base must deprotonate a certain number of Bronsted acid groups to allow the resist to become soluble. The amount of deprotonation required for photoresist solubility is known as the critical ionization level, and has been well described in the literature (see G. Willson, et al. J. Vac. Sci. Technol. B 20(2) March/April 2002, 537–543).

Feature sizes on microelectronic devices continue to shrink as these devices become smaller, faster and more powerful. The lithographic development of these smaller feature sizes in aqueous base can become problematic due to image collapse caused by the capillary forces and surface tension of water. Current approaches to solving this problem include IPA vapor drying and bilayer resist technology. The prevention of image collapse in supercritical $CO_2$ dryers for MEM's and other applications is based on the absence of surface tension in supercritical $CO_2$ to avoid the capillary forces that cause image collapse. Each of these potential solutions for image collapse requires additional steps in the lithographic process leading to higher cost and decreased device yield.

Non-smooth edges on developed features become problematic as feature sizes get smaller (*Semiconductor International*; February 2005; p. 44). The roughness of a single edge is known as Line Edge Roughness (LER) and the roughness of a feature defined by two edges is known as Line Width Roughness (LWR). Current approaches to minimizing LER/LWR include modification of the photoresist or etch chemistry, back anti-reflection coating (BARC), or use of a hardmask. All of these approaches generally result in decreased imaging and/or etch performance of the resist, or require additional process steps that increase cost and decrease device yield. Densified $CO_2$ has the ability to penetrate and swell certain amorphous polymers. This facilitates delivery of chemistry into the swollen polymer, and can smooth out surface features. Under proper conditions, these properties can be used in lithography to smooth surfaces without affecting the critical dimensions of a feature.

Commercially available photoresists used for 248-nm lithography, 193-nm lithography, e-beam lithography, and those being developed for EUV-based lithography are not soluble in liquid or supercritical carbon dioxide in the exposed or unexposed state making $CO_2$-based development extremely challenging. Furthermore, Bronsted bases such as TMAH are neutralized in supercritical carbon dioxide which acts as a weak acid. As such, a pH above 7 is not readily accessible in $CO_2$ based systems. Under these conditions, the minimum level of ionization needed to dissolve exposed positive tone photoresist is not achievable.

In carbon dioxide solvent systems, low-polarity polymer species, specifically fluorinated polymers and siloxane-containing polymers are more soluble than polar polymers. This provides an obvious pathway for negative tone image development, as seen in U.S. Pat. No. 5,665,527 to Allen and U.S. Pat. No. 6,379,874 to Ober. However, for Allen and Ober, image transfer in the negative tone using dense $CO_2$ utilizes non-commercial and in some cases impractical fluorinated or siloxane-containing polymers that are not proven resist systems and are unlikely to be adopted by the microelectronics industry.

Hence there is a need for carbon dioxide based development systems that are compatible with traditional 248-nm, 193-nm, 157-nm, e-beam and EUV resists and leverage the physical properties of $CO_2$ as a processing fluid to give reduced image collapse and decreased LER/LWR.

SUMMARY OF THE INVENTION

A method for carrying out positive tone lithography with a carbon dioxide development system, comprising the steps of: (a) providing a substrate, the substrate having a polymer resist layer formed thereon, (b) exposing at least one portion of the polymer resist layer to radiant energy causing a chemical shift to take place in the exposed portion and thereby form at least one light field region in the polymer resist layer while concurrently maintaining at least one portion of the polymer layer unexposed to the radiant energy to thereby form at least one dark field region in the polymer resist layer; (c) optionally baking the polymer resist layer; (d) contacting the polymer resist layer to a carbon dioxide solvent system, the solvent system comprising a polar group, under conditions in which the at least one light field region is preferentially removed from the substrate by the carbon dioxide solvent system as compared to the at least one dark field region; wherein the carbon dioxide solvent system comprises a first phase and a second phase, the first phase comprising carbon dioxide and the second phase comprising a polar fluid, with the at least one light field region being preferentially soluble in the polar fluid as compared to the at least one dark field region. Preferably, the solvent system further comprises a polyol (e.g., a diol). In some embodiments, the carbon dioxide solvent system further comprising a surfactant. In some embodiments, the carbon dioxide system contains not more than 20 percent water by weight. In some embodiments the carbon dioxide solvent system is a liquid; in other embodiments the carbon dioxide solvent system comprises a supercritical fluid.

A second aspect of the invention is a method for carrying out positive tone lithography with a carbon dioxide development system, comprising the steps of: (a) providing a substrate, the substrate having a polymer resist layer formed thereon, (b) exposing at least one portion of the polymer resist layer to radiant energy causing a chemical shift to take place in the exposed portion and thereby form at least one light field region in the polymer resist layer while concurrently maintaining at least one portion of the polymer layer unexposed to the radiant energy to thereby form at least one dark field region in the polymer resist layer; (c) optionally baking the polymer resist layer; (d) contacting the polymer resist layer to a first carbon dioxide system, wherein the first carbon dioxide system is heterogenous and comprises carbon dioxide, a polyol such as a diol, and water, under conditions in which the at least one light field region is preferentially removed from the substrate by the first carbon dioxide system as compared to the at least one dark field region, and then (e) contacting the polymer resist layer to a second carbon dioxide system comprising carbon dioxide and a rinsing agent under conditions in which the the first carbon dioxide system is rinsed away from the substrate without substantial removal of the dark field region In some embodiments the first carbon dioxide solvent system further comprising a surfactant. In some embodiments the first carbon dioxide system contains not more than 20 percent water by weight. In some embodiments the first carbon dioxide solvent system is a liquid; in other embodiments the first carbon dioxide solvent system comprises a supercritical fluid.

A further aspect of the present invention is a heterogeneous carbon dioxide system useful in carrying out positive tone lithography comprising or consisting essentially of: (a) from 30 to 99 percent by weight of a first phase, the first phase comprising or consisting essentially of carbon dioxide; and (b) from 1 to 70 percent by weight of a second phase, the second phase comprising or consisting essentially of polyol and water at a mix ratio of from 50:50 to 90:10 by weight; and (c) from 0 to 5 percent by weight of a surfactant in the first phase, the second phase, or both the first and second phases. In some embodiments the second phase comprises or consists essentially of polyol and water at a polyol:water mix ratio of from 60:40 to 80:20.

DETAILED DESCRIPTION OF THE PREFERRED EMBODIMENTS

The present invention is explained in greater detail in the specification set forth below. Applicants specifically intend that the disclosures of all United States patent references that are cited herein be incorporated herein by reference in their entirety.

1. Substrates and coatings. The present invention may be carried out on a variety of substrates in which lithographic patterning is used to define features during the manufacturing process. As such, the invention may be used in the manufacture of semiconductors, miroelectromechanical devices (MEM's), optoelectronics, etc. The present invention can be carried out on substrates for these devices including silicon, germanium, gallium aresenide, indium phosphide, cadmium sulfide, zinc oxide, etc.

Photochemically active resists may be applied by spin coating from solvent or other suitable technique. The resist typically comprises a polymeric material, and may be a positive-acting resist or a negative-acting resist. Any suitable resist composition can be used in conjunction with the present invention, including but not limited to those described in U.S. Pat. Nos. 6,165,678; 6,103,866; 6,042, 997; 5,989,776; 5,922,518; 5,866,304; 5,492,793; 5,443, 690; 5,071,730; 4,980,264; and 4,491,628.

The resist preferably comprises or consists essentially of polymer and photoacid generator (along with other customary additives), where the polymer is insoluble in $CO_2$. In previous cases (for example U.S. Pat. No. 5,665,527 to Allen and U.S. Pat. No. 6,379,874 to Ober), negative tone development of resists that were specifically designed to be developed in $CO_2$ were described. Generally, incorporation of fluorocarbon groups or siloxane-based groups is required to make the prototype, non-conventional resists disclosed by Allen and Ober CO2-philic. These types of resists are not specifically designed to be developed in TMAH (Aqueous base), as are the resists useful in the current invention. Additionally, the prototype fluorinated or siloxane-based resists may or may not have the imaging and etch resistant properties required for high volume manufacturing already designed in the conventional non-fluorine, non-siloxane containing resists. The present invention can be used to develop commercially available resists that are designed to be developed in aqueous base. The $CO_2$ based development process described here can be used on photoresists that are currently being used in industry and have a proven history of performance.

For example, in some embodiments the resist composition includes a photosensitive acid generator. Upon exposure to radiation, the radiation-sensitive acid generator generates a strong acid. A variety of photosensitive acid generators can be used in the composition. Generally, suitable acid generators have a high thermal stability (preferably to temperatures greater than 160° C.) so they are not degraded during pre-exposure processing. Suitable acid generators include ionic iodonium sulfonates, e.g., diaryl iodonium (alkyl or aryl)sulfonate and bis-(di-t-butylphenyl)iodonium camphanylsulfonate; aryl (e.g., phenyl or benzyl)triflates and derivatives and analogs thereof, e.g., triphenylsulfonium triflate or bis-(t-butyl phenyl)iodonium triflate; pyrogallol derivatives (e.g., trimesylate of pyrogallol); onium salts such as triarylsulfonium and diaryliodonium hexafluoroantimonates, hexafluoroarsenates, trifluoromethane sulfonates and others; trifluoromethanesulfonate esters of hydroxyimides, alpha,alpha'-bis-sulfonyl-diazomethanes; sulfonate esters of nitro-substituted benzyl alcohols; naphthoquinone-4-diazides; and alkyl disulfones. Other suitable photoacid generators are disclosed in Reichmanis et al. (1991), Chemistry of Materials 3:395. Additional suitable acid generators useful in conjunction with the compositions and methods of the invention will be known to those skilled in the art and/or described in the pertinent literature (see, e.g., U.S. Pat. No. 6,165,678).

The resist composition may additionally, if necessary or desirable, include customary additives such as dyes, sensitizers, additives used as stabilizers and acid-diffusion controlling agents, coating aids such as surfactants or anti-foaming agents, adhesion promoters and plasticizers.

The resist composition may additionally, if necessary or desirable, include additional materials (known to those skilled in the art) such as antireflective layers. The resist composition may also contain additional materials such as second thin film layers creating multi-layer resist compositions typically used to enhance etch resistance.

2. Heterogeneous carbon dioxide systems. Substrates in the described invention are exposed to a heterogeneous $CO_2$ mixture that contains densified carbon dioxide (in the liquid or supercritical state) and a secondary separate liquid phase. The secondary liquid phase comprises or consist essentially of a homogenous solution of water and polyol (e.g., a diol). Optionally, the heterogeneous $CO_2$ mixture may contain surfactants, wetting agents, rinsing aids or cosolvents to facilitate the chemistry of development and/or rinsing of the secondary liquid phase.

In a preferred embodiment, the substrate is in a pressure vessel containing densified carbon dioxide. The polyol/water mixture is added to the surface of the substrate and remains there for the desired period of exposure. Next, a homogeneous solution of rinsing agent in carbon dioxide is flushed into the cell to dissolve the polyol/water mixture without affecting the substrate. Broadly, this rinsing agent is a surface active chemical that contains at least one $CO_2$-philic group and at least one polar functional group. When a sufficient amount of the homogeneous solution of rinsing agent in carbon dioxide has been flushed through the cell to rinse away the polyol/water mixture, carbon dioxide (e.g., pure carbon dioxide or essentially pure carbon dioxide) is flushed through the pressure vessel and the chamber is vented. Optionally, the $CO_2$ may be displaced by helium (He) prior to chamber venting.

In another preferred embodiment, the substrate is in a pressure vessel containing densified carbon dioxide. A solution comprising or consisting essentially of polyol, water, surfactants and cosolvents is added into the pressure vessel. Upon agitation, the polyol solution forms a suspension of droplets in the densified carbon dioxide. After the desired exposure time, a homogeneous solution of rinsing agent in carbon dioxide is flushed into the cell to rinse away the polyol solution without affecting the substrate. Following the rinsing agent flush, pure carbon dioxide is rinsed through the vessel and the chamber is vented.

3. Polyol/water solutions. The polyol/water solutions described herein are effective for the selective removal of light field areas from the substrate at pH<7. As such, they are compatible with use in the acidic environment of carbon dioxide. In contrast, even highly concentrated solutions of TMAH are ineffective as photoresist developers in carbon dioxide because they become neutralized by carbonic acid. Moreover, the polyol solutions described here can all be dissolved in solutions of functionalized fluorochemicals in carbon dioxide to facilitate rinsing.

The polyol is, in general, a diol such as a 1,2 diol or a 1,3 diol, examples of which include but are not limited to ethylene glycol, propylene glycol, 1,2 propanediol, 2-methyl-1,3-propanediol, neopentyl glycol, 2,2-diethyl-1,3-propanediol, 1,3 butanediol, 1,2-butanediol, 2,3-butanediol, pinacol, 1,2-pentanediol, 2,4-pentanediol, 2,4-dimethyl-2,4-pentanediol, 1,2-hexanediol, etc. Polyols, including diols, are well known. See, e.g., U.S. Pat. Nos. 6,887,918; 6,875,389; 6,872,758; 6,872,681; and 6,870,024.

Preferred polyols are ethylene glycol and propylene glycol. The polyol and water are mixed at ratios ranging from 50:50 to 90:10 polyol:water (weight:weight). Preferred mix ratios range from 60:40 to 80:20 polyol:water (w:w). In a particularly preferred embodiment, the polyol/water solution is 70:30 ethylene glycol:water (w:w). In another preferred embodiment, the polyol/water solution is 65:35 propylene glycol:water (w:w).

The polyol/water solution is added to the chamber between 1 and 30% by volume, with the balance made up of $CO_2$.

4. Rinsing agent solutions. The role of the rinsing agent solution is to facilitate rinsing and removal of the polyol/water phase without removing any of the non-exposed photoresist. The polyol/water solutions described in this invention are not miscible with $CO_2$ at the concentrations required for lithographic development. In order to leverage the benefits of low surface tension $CO_2$, the non-miscible polyol/water solution must be rinsed away from the substrate and replaced with a homogenous $CO_2$ solution prior to $CO_2$ flush and vent. There are a limited number of homogenous solvent/$CO_2$ solutions that will not dissolve unexposed photoresist in $CO_2$ and a smaller subset of these that will also make the polyol/water solution compatible with $CO_2$ for rinsing. The homogenous rinsing agent solutions described here are made up from this small subset of chemistries.

Broadly, the rinse agent is a surface active chemical consisting of at least one $CO_2$-philic group to provide $CO_2$ solubility and at least one polar group to help compatibilize the polyol solution for $CO_2$ rinsing. In addition to rinsing agents, they may also be described as emulsifiers or surfactants. The $CO_2$-philic portion of the rinsing agent preferably consists of fluorochemical, siloxane or ether-carbonate groups. The polar portion of the rinsing agent preferably consists of hydroxyl, ketone, ester, amide, thiol, acid, amine or ether functional groups.

More preferably, the rinsing agent is preferably selected from the group including Fluorolink L, Fluorolink C, Fluorolink D, Fluorolink E, Fluorolink T, Fluorolink L10, Fluorolink A10, Fluorolink D10, Fluorolink E10, Fluorolink T10, Fluorolink 7004 (all Fluorolink products from Solvay Solexis), Novec HFE 7100, 7200, and 7500 (3M company), 2,2,3,3,4,4,4-heptafluoro-1-butanol, 3,3,4,4,5,5,6,6,7,7,8,8,8-tridecafluoro-1-octanol, 2,2,3,3,4,4,5,5,6,6,7,7,8,8,8-pentadecafluoro-1-octanol, and 2,2,3,3,4,4,5,5,-octafluoro-1,6-hexanediol.

In one embodiment, the substrate is contacted with the homogenous solution of rinsing agent in $CO_2$. In this case, the homogenous solution is formed prior to delivery into the pressure chamber containing the substrate.

In a second embodiment, the substrate is initially contacted with the rinsing agent prior to formation of the homogenous solution of rinsing agent in $CO_2$. In this case, the homogenous solution of rinsing agent in $CO_2$ is formed in the pressure chamber containing the substrate.

In one embodiment, the homogenous solution of rinsing agent in $CO_2$ contains between 10 and 60% rinsing agent. In a more preferred embodiment, the homogenous solution contains between 20 and 50% rinsing agent.

5. Development Systems. In one embodiment of the invention, the polarity of the polymer resist in the light-field region is increased by the radiant energy. In another embodiment of the invention, the molecular weight of the polymer resist in the light-field region is decreased by the radiant energy. These changes are examples of a "chemical switch" or "chemical shift". Of course, the two processes (increased polarity, decreased molecular weight) may occur concurrently with one another upon exposure of the polymer resist to radiant energy.

Dense phase carbon dioxide, liquid and supercritical $CO_2$ phases, have solvent properties that are significantly 'tuneable' over a large range of pressures and temperatures. Whereas conventional solvents and water may have density changes of <5% over a temperature range of 20° C., the density of liquid and supercritical $CO_2$ can change dramatically over the same range (e.g., 60% between 35° C. and 55° C. at 125 bar). The changes in fluid density as a function of pressure can also be significant as the pressure of supercritical $CO_2$ changes. At 55° C., the density of supercritical $CO_2$ fluid changes 125% between 100 and 200 bar. While fluid density does not completely account for the solubility or phase behavior properties of molecules in $CO_2$ fluid, it is a generally good indicator.

The current invention discloses a class of materials and dense carbon dioxide compositions useful in the image development of conventional chemically amplified photoresists in liquid or supercritical carbon dioxide. The development agents are polyol/water solutions with pH<7. These development agents are incorporated into biphasic $CO_2$ systems to preferentially remove light field areas of photoresist. This biphasic $CO_2$ system may also contain cosolvents, surfactants, dispersants, wetting agents or mixtures of adjuncts to facilitate the photoresist development and/or rinsing of the developing agents. Following a suitable development time, the biphasic $CO_2$ mixture is displaced through rinsing with a homogeneous solution of functionalized fluorochemical in $CO_2$. When the biphasic mixture of polyol/water in $CO_2$ is removed from the pressure vessel, the cell is flushed with pure $CO_2$, and then vented. Optionally, the homogenous solution of fluorochemical in $CO_2$ or the pure $CO_2$ may be pushed out with supercritical He.

In one embodiment, the substrate is contacted with a biphasic mixture containing 15% of a separate phase of 70/30 ethylene glycol/water (w/w) at 1200 psi and 10° C. After one minute a homogenous solution of 30% functionalized fluorochemical in $CO_2$ is pushed into the cell with concomittant venting at a rate of 40 ml/min. After pure $CO_2$ flush and vent, the light field areas of the substrate have been preferentially removed.

5. Lithography techniques. In general, photolithography involves the transfer of a design on a mask to a printed image in resist/photoresist material on a semiconductor substrate. There are a number of commonly recognized physical factors that contribute to differences between the design and the printed image. Lithography is well known and the steps thereof in the context of the present invention may be carried out by any suitable technique, including but not limited to those described in *Introduction to Microlithography*, Eds. Thompson et al. (Washington, D.C.: American Chemical Society, 1994), and in U.S. Pat. Nos. 6,383,719; 6,162,577; 5,780,188; 5,736,281; and 5,532,090.

In some embodiments, the process for generating a resist image on a substrate comprises the steps of: (a) coating a substrate with a film comprising the resist composition; (b) imagewise exposing the film to radiation/radiant energy; and (c) developing the image with a carbon dioxide system as described herein. The first step involves coating the substrate with a film comprising the resist composition dissolved in a suitable solvent. Suitable substrates include but are not limited to those described above. The substrate may or may not be coated with an organic anti-reflective layer prior to deposition of the resist composition. Preferably, the surface of the substrate is cleaned before the film is deposited thereon. In some embodiments, before the film has been exposed to radiation, the film is heated to an elevated temperature of about 90–150° C. for a short period of time, typically on the order of about 1 minute. In some embodiments the dried film may have a thickness of about 0.1–5.0 microns, or more particularly about 0.2–1.0 microns. In the second step of the process, the film is imagewise exposed to x-ray, electron beam, ultraviolet radiation/light (including deep ultraviolet light and extreme ultraviolet (EUV) light, 248-nm light, 193-nm light, 157-nm light, etc.), or other source of radiant energy (e-beam). The radiation is sufficient to initiate a chemical reaction in the resist film to increase the polarity thereof and/or decrease the molecular weight thereof (e.g., by generating free acid which causes cleavage of an acid-cleavable substituent and formation of the corresponding acid or alcohol or other base soluble functional groups). The carbon dioxide can serve to dilate or swell the polymer resist and hence obviate the need for a post exposure bake step, or a post exposure bake step may optionally be utilized in accordance with known techniques. The third step involves development of the image with a carbon dioxide system as described above, utilizing the systems described herein in a manner that preferentially removes the exposed "light-field" region of the photoresist.

The present invention is explained in greater detail in the following non-limiting Examples.

EXAMPLE 1

A chemically amplified positive tone photoresist with photoacid generator is coated onto a substrate and baked to remove residual solvent. The substrate is exposed to incident light through a pattern transfer mask and then baked to complete hydrolysis of chemically active groups. Preferential removal of the exposed light field region of the photoresist in $CO_2$ is then accomplished in the following manner. The substrate is placed in a pressure vessel at 10° C. Carbon dioxide is added into the pressure vessel up to 1200 psi. A solution of 70/30 ethylene glycol/water is then added to the pressure vessel to cover the surface of the substrate by displacing an equivalent amount of $CO_2$ which is simultaneously vented from the vessel. After one minute, a volume of Fluorolink 7004 (Solvay Solexis) equal to 20% of the vessel volume is added to the surface of the substrate immediately prior to beginning a $CO_2$ flush at 40 ml/min. After 6 chamber volumes of $CO_2$ have been flushed through the vessel, the chamber is vented and the substrate is removed and shows selective removal of the exposed, "light field" areas of the substrate.

EXAMPLE 2

A chemically amplified positive tone photoresist with photoacid generator is coated onto a substrate and baked to remove residual solvent. The substrate is exposed to incident light through a pattern transfer mask and then baked to complete hydrolysis of chemically active groups. Preferential removal of the exposed light field region of the photoresist in $CO_2$ is then accomplished in the following manner. The substrate is placed in a pressure vessel at 10° C. A biphasic solution of carbon dioxide containing a separate phase of 65/35 propylene glycol/water containing 5% of a fluorinated cationic surfactant is added to the vessel to a pressure of 1200 psi. Upon stirring, a suspension of the separate phase in $CO_2$ is formed. After 2 minutes, a volume of Fluorolink 7004 (Solvay Solexis) equal to 20% of the vessel volume is added to the surface of the substrate immediately prior to beginning a $CO_2$ flush at 40 ml/min. After 6 chamber volumes of $CO_2$ have been flushed through the vessel, the $CO_2$ is displaced from the chamber by supercritical He at 3000 psi. The He is then vented and the substrate is removed and shows selective removal of the exposed, "light field" areas of the substrate.

The foregoing is illustrative of the present invention, and is not to be construed as limiting thereof. The invention is defined by the following claims, with equivalents of the claims to be included therein.

That which is claimed is:

1. A method for carrying out positive tone lithography with a carbon dioxide development system, comprising the steps of:
   (a) providing a substrate, the substrate having a polymer resist layer formed thereon,
   (b) exposing at least one portion of the polymer resist layer to radiant energy causing a chemical shift to take place in the exposed portion and thereby form at least one light field region in the polymer resist layer while concurrently maintaining at least one portion of the polymer layer unexposed to the radiant energy to thereby form at least one dark field region in said polymer resist layer;

(c) optionally baking the polymer resist layer;

(d) contacting the polymer resist layer to a carbon dioxide solvent system, said solvent system comprising a polar group, under conditions in which said at least one light field region is preferentially removed from said substrate by said carbon dioxide solvent system as compared to said at least one dark field region;

wherein said carbon dioxide solvent system comprises a first phase and a second phase, said first phase comprising carbon dioxide and said second phase comprising a polar fluid, with said at least one light field region being preferentially soluble in said polar fluid as compared to said at least one dark field region;

and wherein said solvent system further comprises a polyol.

2. The method of claim 1, wherein said polyol is a diol.

3. The method according to claim 1, wherein said polyol is a diol selected from the group consisting of ethylene glycol, propylene glycol, 1,2 propanediol, 2-methly-1,3-propanediol, neopentyl glycol, 2,2-diethyl-1,3-propanediol, 1,3 butanediol, 1,2-butanediol, 2,3-butanediol, pinacol, 1,2-pentanediol, 2,4-pentanediol 2,4-dimethyl-2,4-pentanediol, 1,2-hexanediol.

4. The method of claim 1, said carbon dioxide solvent system further comprising a surfactant.

5. The method of claim 1, said carbon dioxide system containing not more than 20 percent water by weight.

6. The method of claim 1, wherein said carbon dioxide solvent system is a liquid.

7. The method of claim 1, wherein said carbon dioxide solvent system comprises a supercritical fluid.

8. The method according to claim 1, wherein said substrate is a microelectronic substrate.

9. The method according to claim 1, wherein said radiant energy is deep UV light.

10. The method according to claim 1, wherein said radiant energy is extreme UV light.

11. A method for carrying out positive tone lithography with a carbon dioxide development system, comprising the steps of:

(a) providing a substrate, the substrate having a polymer resist layer formed thereon, (b) exposing at least one portion of the polymer resist layer to radiant energy causing a chemical shift to take place in the exposed portion and thereby form at least one light field region in the polymer resist layer while concurrently maintaining at least one portion of the polymer layer unexposed to the radiant energy to thereby form at least one dark field region in the polymer resist layer;

(c) optionally baking the polymer resist layer;

(d) contacting said polymer resist layer to a first carbon dioxide system, wherein said first carbon dioxide system is heterogenous and comprises carbon dioxide, a polyol, and water, under conditions in which the at least one light field region is preferentially removed from said substrate by said first carbon dioxide system as compared to said at least one dark field region, and then (e) contacting said polymer resist layer to a second carbon dioxide system comprising carbon dioxide and a rinsing agent under conditions in which the said first carbon dioxide system is rinsed away from the substrate without substantial removal of said dark field region.

12. The method of claim 11, wherein said polyol is a diol.

13. The method of claim 11, wherein said polyol is a diol selected from the group consisting of ethylene glycol, propylene glycol, 1,2 propanediol, 2-methly-1,3-propanediol, neopentyl glycol, 2,2-diethyl-1,3-propanediol, 1,3 butanediol, 1,2-butanediol, 2,3-butanediol, pinacol, 1,2-pentanediol, 2,4-pentanediol, 2,4-dimethyl-2,4-pentanediol, 1,2-hexanediol.

14. The method of claim 11, said first carbon dioxide solvent system further comprising a surfactant.

15. The method of claim 11, said first carbon dioxide system containing not more than 20 percent water by weight.

16. The method of claim 11, wherein said first carbon dioxide solvent system is a liquid.

17. The method of claim 11, wherein said first carbon dioxide solvent system comprises a supercritical fluid.

18. The method of claim 11, wherein said substrate is a microelectronic substrate.

19. The method of claim 11, wherein said radiant energy is deep UV light.

20. The method of claim 11, wherein said radiant energy is extreme UV light.

* * * * *

UNITED STATES PATENT AND TRADEMARK OFFICE
CERTIFICATE OF CORRECTION

PATENT NO. : 7,235,347 B2  Page 1 of 1
APPLICATION NO. : 11/133077
DATED : June 26, 2007
INVENTOR(S) : Wagner et al.

It is certified that error appears in the above-identified patent and that said Letters Patent is hereby corrected as shown below:

On Title Page:

Item (75) Inventors: Please correct to read:
--Mark Wagner, Raleigh, NC (US);
James DeYoung, Raleigh, NC (US);
Merrick Miles, Raleigh, NC (US);
Chris Harbinson, Raleigh, NC (US)--

Signed and Sealed this

Sixth Day of October, 2009

David J. Kappos
*Director of the United States Patent and Trademark Office*